United States Patent [19]
Macovski

[11] Patent Number: 4,639,671
[45] Date of Patent: Jan. 27, 1987

[54] SIMULTANEOUS NMR IMAGING SYSTEM

[75] Inventor: Albert Macovski, Menlo Park, Calif.

[73] Assignee: General Electric Company, Milwaukee, Wis.

[21] Appl. No.: 603,333

[22] Filed: Apr. 24, 1984

Related U.S. Application Data

[63] Continuation-in-part of Ser. No. 499,218, May 31, 1983, abandoned.

[51] Int. Cl.$^4$ .............................................. G01R 33/20
[52] U.S. Cl. ..................................... 324/309; 324/306; 324/307
[58] Field of Search ............... 324/300, 307, 309, 310, 324/306, 311, 313, 312

[56] References Cited

U.S. PATENT DOCUMENTS

| | | | |
|---|---|---|---|
| 3,786,341 | 1/1974 | Anderson | 324/310 |
| 4,472,683 | 9/1984 | Sekihara | 324/307 |
| 4,516,075 | 5/1985 | Moran | 324/309 |
| 4,565,968 | 1/1986 | Macovski | 324/309 |

FOREIGN PATENT DOCUMENTS

| | | | |
|---|---|---|---|
| 2822953 | 5/1978 | Fed. Rep. of Germany | |
| 1596160 | 8/1981 | United Kingdom | |
| 1601816 | 11/1981 | United Kingdom | 324/309 |

OTHER PUBLICATIONS

P. A. de Jager et al., Novel Method for Determination of Flow Velocities with Pulsed Nuclear Magnetic Resonance, Rev. Sci. Instrum, 49(8) Aug. 78, pp. 1217, 1218.

Waldo S. Hinshaw, Image Formation by Nuclear Magnetic Resonance. The Sensitive Point Method, J of Appl. Phys., vol. 47, No. 8, Aug. 1976, pp. 3709-3721.

W. K. Genthe, NMR Applied to Flow Measurement, INSTRUMENTATION TECHNOLOGY, Nov. 1968, pp. 53-58.

Andrew, "Nuclear Magnetic Resonance Imaging the Multiple Sensitive Point Method, IEEE Trans on Nuclear Science, vol. 527, No. 8, 1980.

Feiner, "On NMR Spin Imaging by Magnetic Field Modulation", Applied Physics, vol. 22, pp. 257-271, 1980.

Primary Examiner—Michael J. Tokar
Attorney, Agent, or Firm—Flehr, Hohbach, Test, Albritton & Herbert

[57] ABSTRACT

The nuclei in a volume are imaged using one or more time-varying gradient fields. The resultant signals are heterodyned using a signal having a related time-varying component. Equivalently, the spectrum of the resultant signal is convolved with the spectrum of the heterodyne signal. Following integration, depending on the amplitude of the time-varying component of the heterodyne signal, any point in the volume can be studied from the same received signal.

56 Claims, 11 Drawing Figures

SIMULTANEOUS NMR IMAGING SYSTEM

This is a continuation in part of application 499,218 filed May 31, 1983, now abandoned.

BACKGROUND OF THE INVENTION

1. Field of the Invention

This invention relates to NMR imaging. In a primary application it relates to defining the NMR parameters of all regions of a volume through simultaneous data acquisition.

2. Description of Prior Art

In recent years significant attention has been focused onto the problem of NMR imaging. Here the fundamental problem is that of spatial localization where various NMR parameters are measured at specific local regions within a volume. One of the most significant contributions to the localization problem was the sensitive-point method of Waldo S. Hinshaw. This is described in a paper by Hinshaw entitled, "Image Formation by Nuclear Magnetic Resonance: The Sensitive-Point Method," in the *Journal of Applied Physics,* Vol. 47, pp. 3709–3721, August 1967 and in British Pat. No. 1,508,438 and U.S. Pat. No. 4,015,196 issued to W. S. Moore and W. S. Hinshaw.

The fundamental method involves the use of time-varying or a.c. gradient fields. In its simplest embodiment a.c. gradient fields of different frequencies are applied to all three axes. The demodulated signal is then integrated so that all temporal variations are removed. The resultant integrated signal is therefore sensitive only to the null region of the various gradient fields. One point in space, corresponding to the null of all three a.c. gradient fields, provides an integrated output signal. To provide an image, the a.c. gradient fields are altered to move the null point. This method is effective, but slow, since one point at a time is acquired, and each point requires significant integration time.

It is interesting to note that, in British Pat. No. 1,508,438 the inventors indicate that each point in the volume experiences a unique time dependency which is distinguishable from signals produced by other points in the volume. However, in all published material to this date, no method has been shown for studying any point other than the null point; thus making the method effective, but very slow. Its unusually slow speed has kept it from use in generalized image applications where other methods have been dominant. Its only present day use has been that of localized spectrometry where the NMR spectrum of any desired local region can be studied. One example of this is in a paper by Katherine N. Scott, et al. entitled, "Spatial Localization of $^{31}P$ Nuclear Magnetic Resonance Signal by the Sensitive Point Method," appearing in the *Journal of Magnetic Resonance,* Vol. 50, pp. 339–344, 1982.

As previously indicated, the use of three a.c. gradient signals followed by integration isolates a specific point. Similarly, two a.c. gradients isolate a line and one a.c. gradient isolates a plane, using the same null phenomenon. The use of lines or planes can be part of various combined imaging systems such as those involving reconstruction from projections. In addition, it should be pointed out that two of the a.c. gradient fields can be of the same frequency but shifted by 90° in phase, providing the required orthogonality. An interesting variation on the sensitive point method is described in British Pat. No. 1,601,816 invented by Waldo S. Hinshaw where a line array of points are acquired simultaneously. Here a.c. gradients, such as two orthogonal sinusoids, are applied to two axes with a static gradient on the third axis. The filtering of the a.c. signals limits the acquisition to the line defined by the intersection of the null planes. However, due to the static gradient, each point along the null line represents a different frequency. Thus Fourier transformation of the filtered signal provides simultaneous information about points along the null line. However, no method is shown of studying the activity of points in other lines other than changing the a.c. gradients and decomposing a new line, with its attendant problems of long acquisition time.

One method, however, does provide for the simultaneous acquisition of data of points within a plane. This method, known as the echo planar system is described in a paper by P. Mansfield and I. L. Pykett in the *Journal of Magnetic Resonance,* vol. 29, p. 355, 1978. It is also described in the book by P. Mansfield and P. G. Morris NMR *Imaging in Biomedicine,* Academic Press, 1982. In this method an xy plane is excited and, while the resultant signals are recieved, a static gradient is applied in the x dimension and a square wave gradient in the y dimension. The square wave gradient essentially involves amplitude modulation of each region at a frequency based on its y position. Because of the periodic modulation, discrete regions along y are received each representing a different frequency. These discrete y positions are superimposed on a continuous frequency spectrum representing the x coordinates due to the static gradient. Thus each frequency represents a spatial position with all of the spatial information acquired simultaneously.

This system has a number of problems. Firstly, the modulation technique, resulting in discrete frequencies, limits the data acquisition to discrete positions in the y dimension rather than the desired ability to access all regions. This modulation technique also limits the matrix size or system resolution as pointed out by Mansfield. Also, although in theory the method is applicable to acquiring all three dimensions simultaneously by using an additional modulated z gradient, this would result in severe spectral complexity and has yet to be attempted as far as published literature is concerned.

The limitation of the technique essentially lies in the fact that each spatial position is represented by a specific region of the frequency spectrum of the signal.

A variation on the echo planar system was described in a paper by M. M. Tropper in the *Journal of Magnetic Resonance,* vol. 42, pp. 193–202, 1981 entitled "Image Reconstruction for the NMR Echo-Planar Technique, and for a Proposed Adaptation to Allow Continuous Data Acquisition." As with the echo planar system, data is acquired from a single plane using one static and one time-varying gradient during the receiving time. The signal processing, however, makes more efficient use of the signal. The specific processing system shown, however, is quite complex in that it involves a unique sampling sequence followed by a Fourier transform for each image point. It does, however, provide improved performance over the original echo planar method. The paper does not discuss simultaneous acquisition of information from the entire volume.

SUMMARY OF THE INVENTION

An object of this invention is to simultaneously acquire information on the NMR activity of a plurality of points in a region.

A further object of this invention is the high-speed acquisition of information on NMR activity to avoid the affects of motion.

A further object of this invention is the simultaneous acquisition of NMR spectroscopic data from a number of points in a region.

A further object of this invention is the simultaneous acquisition of flow data from a number of points in a region.

A further object of this invention is to obtain NMR data with relative immunity to inhomogeneity of the main magnetic field.

Briefly, in accordance with the invention, one or more time-varying a.c. gradient fields are used while NMR signals are being received. These received signals are heterodyned or multiplied using a signal which is modulated with a function of the gradient signal. Alternatively, in an equivalent operation, the signal spectrum is convolved with the spectrum of the multiplying signal. The resultant integrated signal can represent the NMR activity of any desired point in the excited region. NMR parameters including the spectrum, density, relaxation times or flow can be extracted.

BRIEF DESCRIPTION OF THE DRAWINGS

For a more complete disclosure of the invention, reference may be made to the following detailed description of several illustrative embodiments thereof which is given in conjunction with the accompanying drawings, of which.

DESCRIPTION OF THE PREFERRED EMBODIMENT

Figure 1:
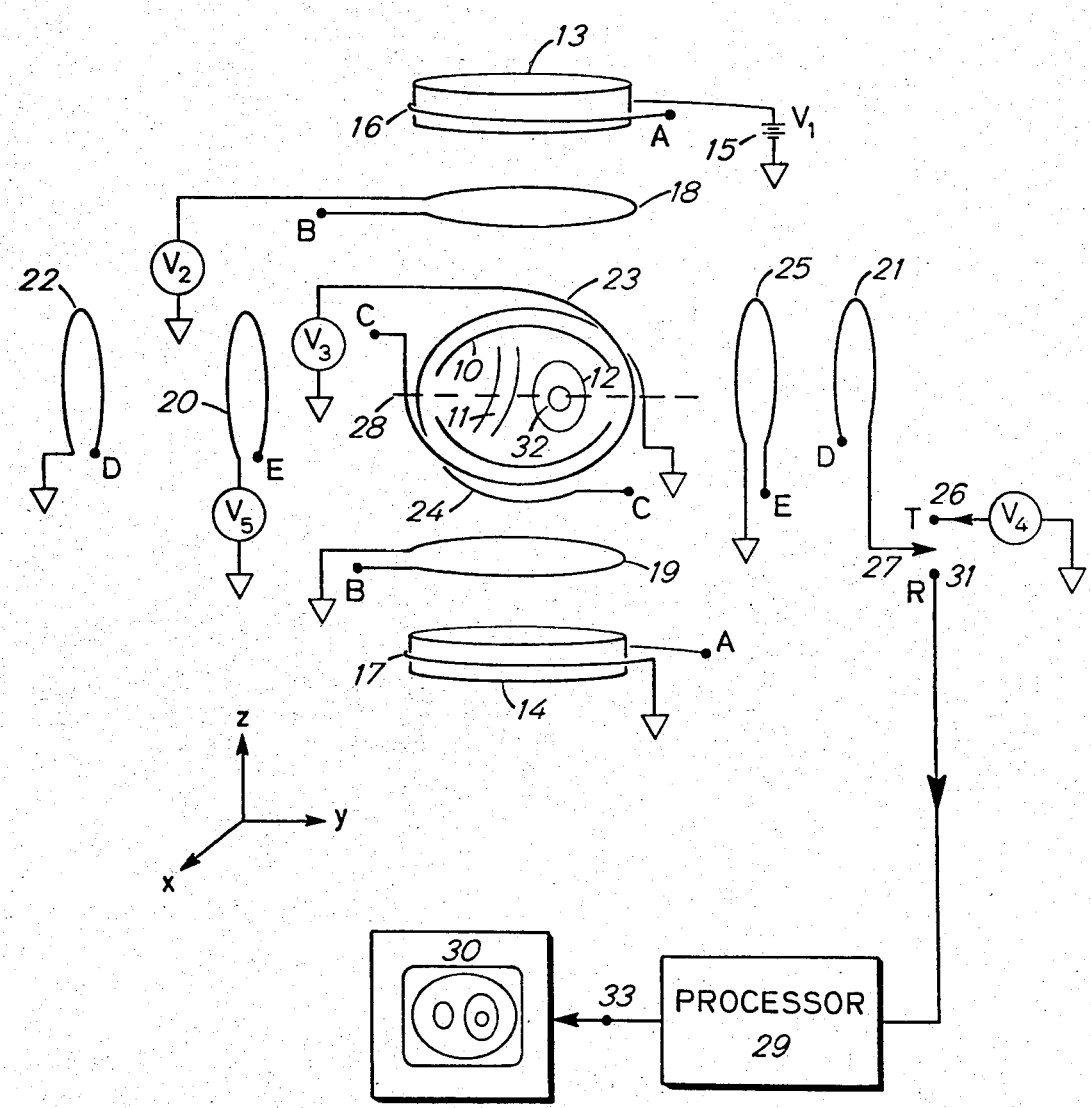
FIG. 1 is a schematic representation of an embodiment of the invention.

An understanding of the broad aspects of the invention may best be had by reference to FIG. 1 where the NMR parameters of object 10 are imaged. In general, the principle axial magnetic field is produced using, for example, pole pieces 13 and 14 excited by coils 16 and 17. These are driven by d.c. source $V_1$ with the coils 16 and 17 producing fields in the same direction to create a substantially uniform field throughout the region of interest in volume 10. This is by far the strongest field in the system with a strength of the order of one to ten kilogauss. With both this coil and the remaining coils, the letter pairs A-E are simply convenient ways of indicating connections.

Specific regions are selected using the gradient coils. Coils 18 and 19 form a gradient field in the z direction driven by source $V_2$. Similarly coils 23 and 24 are on opposite sides of object 10 and thus form a gradient field in the x direction driven by source $V_3$ with coils 20 and 25 forming a y gradient field driven by source $V_5$. Unlike coils 16 and 17 which create a uniform field, these gradient coils are bucking each other so as to produce a varying field in the respective direction.

Coils 21 and 22 are the radio frequency coils serving both the transmitter and receiver function. They produce fields in the same direction to create a substantially uniform field in volume 10. When switch 27 is in the transmit position, 26, generator $V_4$, is used to excite the magnetic spins in volume 10. When switch 27 is connected to the receive position, signal 31 is received from magnetic spin signals in volume 10. These are processed in processor 29 to provide various images of NMR parameters which are displayed in display 30.

Although a single rf coil system, 21 and 22, is shown for both transmit and receive, many instruments, for convenience, use separate transmit and receive coils to minimize the coupling, following the transmitter burst. In those cases clearly the transmitter coils would be permanently connected to terminal 26 and driven by $V_4$ while the receiver coils would be permanently connected to 31, feeding signal processor 29. In systems using separate sets of coils it is often useful to have their respective axes in quadrature, to minimize coupling, with both axes perpendicular to the z axes. Thus, if a separate set of receiver coils are added, they would be parallel to gradient coils 23 and 24.

A variety of combinations of excitation signals $V_4$, gradient signals $V_2$, $V_3$ and $V_5$, and processing systems 29 can be used to study specific parameters and regions of volume 10.

As previously indicated the sensitive point, line or plane method involves the use of one or more a.c. gradients. The resultant demodulated signal is integrated to represent the null region of the a.c. fields. For simplicity a single gradient field will be illustrated.

$$\partial m/\partial t = m\{i\omega_0 + i\gamma Gy \cos \omega_m t - t/T_2\}$$

where m is the magnetic moment, $\gamma$ is the magnetogyric constant, G is the gradient amplitude in the y direction, $\omega_m$ the a.c. gradient frequency and $T_2$ the spin-spin relaxation time. Solving the differential equation $$m = m_0 \exp\left\{-i\omega_0 t - i\gamma Gy \int_{t_1}^{t_1+t} \cos\omega_m t\, dt - t/T_2\right\}$$

$$= m_0 \exp\left\{-i\omega_0 t - \frac{i\gamma Gy}{\omega_m}[\sin(\omega_m(t_1 + t)) - \sin\omega_m t_1] - t/T_2\right\}$$

Using the identity $$\exp(iA \sin B) = \sum_{k=-\infty}^{\infty} J_k(A)\exp(ikB)$$

where $J_k(A)$ are Bessel functions of the first kind of order k $$m(t) =$$

-continued $$m_0(r)e^{-i\omega_0 t}e^{-t/T_2}e^{iB}\sum_{k=-\infty}^{\infty} J_k(\gamma Gy/\omega_m)\exp[-ik\omega_m(t_1+t)]$$

where $$B = \frac{\gamma G_y}{\omega_m}\sin\omega_m t_1$$

This signal is synchronously detected at the frequency $\omega_0$ and integrated over a time T giving $$s(r) = \frac{1}{T}\int_0^T m(t)dt$$

$$= \frac{m_0(r)}{T}e^{iB}\sum_{k=-\infty}^{\infty} J_k(\gamma Gy/\omega_m)e^{-ik\omega_m t_1}\frac{1-\exp\left[-\frac{T}{T_2}-ik\omega_m T\right]}{\frac{1}{T_2}+i\omega_m k}$$

If $T\gg T_2$, and we ignore fixed phase factors, the real part of $s(r)$ becomes $$s_R(r) = \frac{M_0(r)}{T}\sum_{k=-\infty}^{\infty} J_k(\gamma Gy/\omega_m)\frac{T_2}{1+(k\omega_m T_2)^2}$$

If $\omega_m T_2 \gg 1$ this can be approximated as $$s_R(r) \simeq m_0(r)\frac{T_2}{T}J_0(\gamma Gy/\omega_m)$$

Here we see the localization of the response to the vicinity of $y=0$ where the response is determined by the $J_0$ function. This represents two problems, firstly we acquire data solely from the null region, secondly the response in the null region is very poor, given the oscillatory behavior of the $J_0$ function. As indicated in the peviously referenced papers, if a series of excitations which are asynchronous and therefore have random $t_1$ starting times are averaged together the $e^{iB}$ term, rather than being a fixed phase factor, also becomes a Bessel function. This provides a spatial response $$s_R(r) = m_0(r)\frac{T_2}{T}J_0^2(\gamma Gy/\omega_m)$$

providing the improved $J_0^2$ response. However, even $J_0^2$ leaves much to be desired as an ideal localization function.

If two oscillating gradients are used in the x and y axes we localize to a line with the response of the form $J_0^2(\gamma Gx/\omega_a)J_0^2(\gamma Gy/\omega_b)$ where $\omega_a$ and $\omega_b$ are the respective gradient modulation frequencies. The frequencies can be the same using quadrature modulation with one gradient signal being of the form $\cos\omega_m t$ and the other $\sin\omega_m t$. For localization to a point, a third frequency can be used to modulate the third gradient axis. Alternatively the third gradient can be static, forming the sensitive line method where each point along the line corresponds to a different frequency. The $J_0^2$ spatial response along each axis can be modified by using non-sinusoidal gradient signals as described in the previously referenced text by P. Mansfield and P. G. Morris providing a response function in each dimension of the form $$\prod_{n=1}^{\infty} J_0^2\left(\frac{\gamma g_n x}{n\omega_m}\right)$$

where Π indicates a product and $g_n$ is the $n^{th}$ harmonic of the gradient signal. Of course the $J_0^2$ indicates that this represents a sequence of excitations having random phase with respect to the gradient modulation, as previously described. This method of sharpening the response has significant limitations. Firstly, it is not a very flexible method of varying the response parameters.

Secondly, non-sinusoidal gradient signals are more difficult to generate and prevent the use of resonant systems which have improved efficiency.

Figure 2:
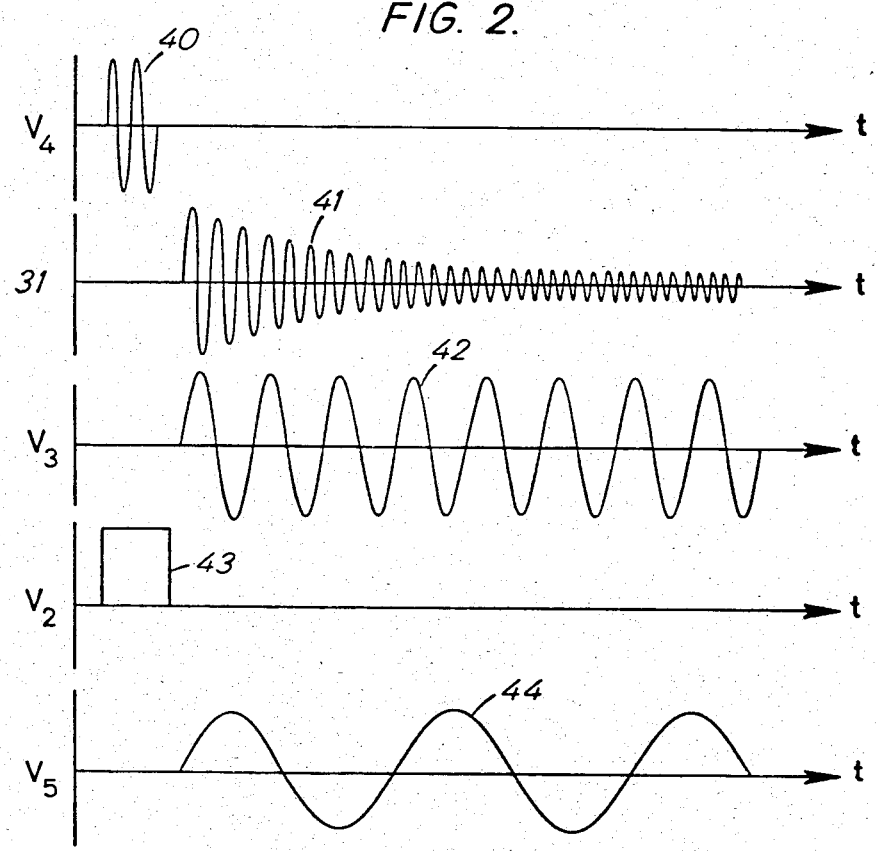
FIG. 2 is a set of representative waveforms of an embodiment of the invention.
Figure 3:
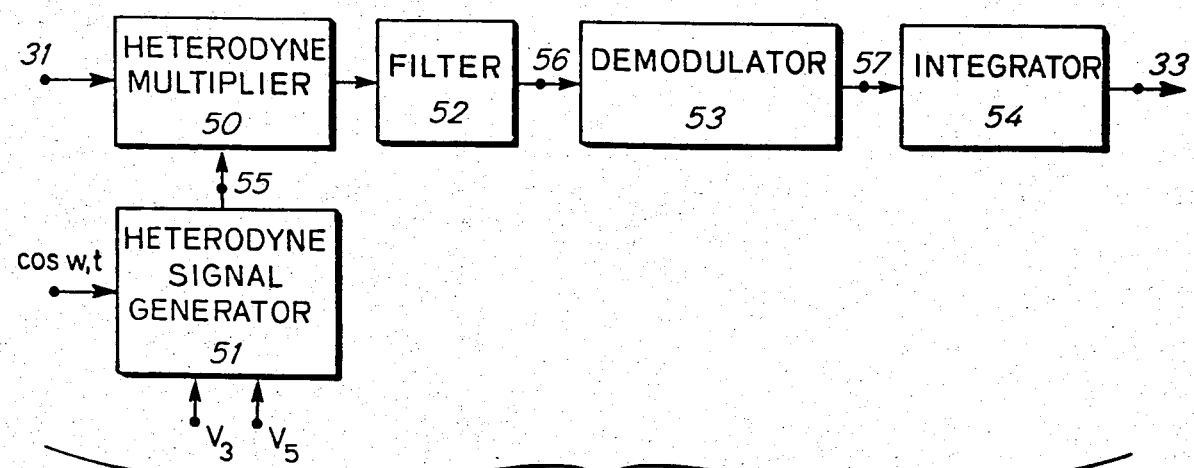
FIG. 3 is a block diagram of an embodiment of the invention.

FIGS. 2 and 3 illustrate the basic system which solves the fundamental problem of selecting any desired region. For simplicity we begin by considering the localization in only one dimension, where a plane is selected out of the entire volume. To do this, we ignore gradient signals $V_2$ and $V_5$. Assume the r.f. excitation signal $V_4$, segment 40, is a broadband signal which excites the entire volume 10 and produces the FID (free induction decay) signal segment 41 as the output signal 31 when switch 27 is moved from the transmit to the receive position. To provide localization in the x dimension, an a.c. gradient signal is used for $V_3$, $G_x$, shown as signal segment 42. If the processing is accomplished as in the preceding analysis, from the previously referenced papers, and the resultant signal is integrated, the planar section, corresponding to the null region of the a.c. gradient, will be selected. If signals from other planar sections are desired, the relative amplitudes in gradient coils 23 and 24 are altered so as to move the null region to a different plane. As previously described this is a sequential and highly time-consuming operation, rendering the system impractical for clinical imaging.

Referring to FIG. 3, instead of directly integrating the signal, we first apply it to mixer or heterodyne multiplier 50. This multiplier multiplies the incoming signal by a heterodyne or mixing signal 55 of the form $$v = \exp\{i\omega_1 t + iK\sin\omega_m(t_1+t)\}$$

where the analytic signal form is being used as is common in electrical engineering. The physical signal is the real part of this signal. Note that this signal has a different carrier frequency, $\omega_1$, but that its phase or frequency modulation is the same form as previously analyzed for the modulated gradient signal. When these sinusoidal signals are mixed or multiplied, sum and difference signals are produced as given by the classic trigonometric relationships. Filters can be used, as are classically done in superheterodyne receivers, to select the sum or difference components. In this example we use filter 52, a band-pass filter with center frequency around $\omega_0-\omega_1$, to select the difference frequency components. We select $\omega_1$ so that the sum and difference spectra are well separated, simplifying the filtering operation. The filtered output, signal 56, is then given by $$v = m_0 \exp\left\{ -i(\omega_0 - \omega_1)t + i\left(K - \frac{\gamma G x}{\omega_m}\right) \sin[\omega_m(t_1 + t)] + iB - t/T_2 \right\}$$

This is identical to the previous expression for the signal m(t) with two exceptions. Firstly, the carrier frequency is at $\omega_0-\omega_1$. Secondly, and much more significant, the amplitude of the sinusoidal modulation component is now $$\left(K - \frac{\gamma G x}{\omega_m}\right).$$

This signal can again be processed as previously described. Firstly it is synchronously detected using demodulator 53 to provide a complex baseband signal. Demodulator 53 can include sine and cosine multipliers at the frequency $\omega_0-\omega_1$. These quadrature demodulators are normally used in processing NMR signals. As previously described, this is followed by integrator 54 which integrates over a time period T. The resultant response, again taking the real part, as before, is given by.

$$s_R(r) = m_0(r) \frac{T_2}{T} J_0\left(K - \frac{\gamma G x}{\omega_m}\right)$$

Note that the null region of the Bessel function occurs at $$x = \frac{\omega_m K}{\gamma G}$$

rather than at x=0, the null plane. We therefore, with this system, have the capability of choosing any region of localization, with the same a.c. gradient signal. Note that K, the phase modulation amplitude of the heterodyne or multiplying signal, is completely under our control. One way of more fully utilizing this system is to store signal 31. Then, using heterodyne signals with different values of phase modulation K, any region can be selected from the same excitation.

The sequence in FIG. 2 can be repeated using arbitrary phase between the excitation of the FID and the gradient modulation signal. As previously stated, this causes the $e^{iB}$ term to vary randomly with each excitation and thus provide a Bessel function on the average. The result of the multiple excitation sequence is therefore $$s_R(r) = m_0(r) \frac{T_2}{T} J_0^2\left(K - \frac{\gamma G x}{\omega_m}\right)$$

providing the improved $J_0^2$ response with again, selectable localization.

Thusfar the fundamental system has been described in one dimension. In FIG. 2, however, the method illustrated can provide three-dimensional imaging where any point in volume 10 is selected. Firstly, in one embodiment of the invention, a planar region is selected in standard fashion. Using a z gradient signal, segment 43, an excitation 40 of a particular frequency will excite a plane of a particular value of z shown as plane 28 in FIG. 1. During the resultant FID 41 a.c. gradients of different and unrelated frequencies, $\omega_x$ and $\omega_y$ are applied as signal segments 42 and 44 of gradient signals $V_3$ and $V_5$.

Again, the resultant signal 31, or a stored version thereof, is applied to heterodyne multiplier or mixer 50. The heterodyne signal 55 is created in signal generator 51 using the two gradient modulation signals $V_3$ and $V_5$ to phase modulate the carrier $\cos \omega_1 t$ to create the signal $$v = \exp\{i\omega_1 t + iK \sin \omega_x(t_1+t) + iL \sin \omega_y(t_1+t)\}$$

If we again integrate repeated excitations, using asynchronous relationships between the gradient signals and the FID excitation, we achieve a response function $$s_R(x,y) = m_0(x,y) \frac{T_2}{T} J_0^2\left(K - \frac{\gamma G x}{\omega_x}\right) J_0^2\left(L - \frac{\gamma G y}{\omega_y}\right)$$

where x,y localization points in the selected z plane are $$x = \frac{\omega_x K}{\gamma G} \text{ and } y = \frac{\omega_y L}{\gamma G}$$

which are completely under our control. For convenience the gradient amplitudes have been assumed equal at the value G. Clearly these could be different with the localization region changing accordingly.

Thus, with the complete system of FIGS. 2 and 3, using a single set of stored data, any point in the selected plane can be studied. This represents a significant change in the use of the sensitive point or sensitive line systems where regions were acquired in sequence.

The system of FIGS. 2 and 3, as shown, acquires data from all points in a selected plane. If the entire volume is imaged the sequence is repeated using different frequencies of burst 40 to select different planes. However, continuing on the same theme, all points in the volume can be simultaneously imaged by using three a.c. gradients of unrelated frequencies. Referring to FIG. 2, the gradient pulse 43 is removed and an a.c. gradient signal of a third frequency $\omega_z$ is substituted, again during the FID 41. Also gradient signal $V_2$ is added to heterodyne signal generator 51 to form signal 55 as given by $$v = \exp\{i\omega_1 t + iK \sin \omega_x t + iL \sin \omega_y t + iP \sin \omega_z t\}$$

The resultant response is then $$s_R(x, y, z) = m_0(x,y,z) \frac{T_2}{T} J_0^2\left(K - \frac{\gamma G x}{\omega_x}\right) J_0^2\left(L - \frac{\gamma G y}{\omega_y}\right) J_0^2\left(P - \frac{\gamma G z}{\omega_z}\right)$$

where K; L and P are selected to study any point in space, using the same stored acquired data.

The demodulation system in FIG. 3 can be somewhat time-consuming in that, as shown, only one point at a time is derived. However, it must be emphasized, that each of these points is derived from the same received data. Thus the patient is involved for a very short period of time, and the resultant processing can all be done off line, after the patient has left. A number of things can be done, however, to reduce the processing time and awkwardness. As a simple example, an array of processors can be used, each identical to that of FIG. 3 and each simultaneously demodulating stored signal 31. Of course each heterodyning signal 55 will have different degrees of phase modulation K, L and P and therefore simultaneously represent different points.

A more flexible and more computationally efficient method imaging many points makes use of the frequency domain representation of FIG. 3. Thus, multiplication of the signals in the time domain is equivalent to convolution in the frequency domain. Again, for simplicity, we begin by considering a single axis thus ignoring $V_2$ and $V_5$ in FIG. 2.

If we observe the spectrum of the received signal 31 in the presence of an a.c. gradient and ignore the slight line broadening due to the $T_2$ decay we have the spectrum $$M(f) = \sum_{n=-\infty}^{\infty} m_n \delta(f - f_0 - nf_m)$$

For convenience we use one-sided spectra corresponding to the analytic signal. With the above approximation the spectra approaches a series of sharp lines or delta functions separated by the gradient frequency $f_m$. The amplitude of each line, $m_n$, is a function of the distribution of the density in the x direction, $m_0(x)$.

The spectrum of the heterodyning signal is given by $$V(f) = \sum_{l=-\infty}^{\infty} k_l \delta(f + f_1 - lf_m)$$

which is again an array of line spectra separated by the phase modulation frequency $f_m$ and where the amplitude of each sideband $k_l$ is determined by the phase modulation factor K. Multiplication of the received signal 31 and the heterodyning signal 55 is equivalent to convolution of the spectra providing $$V(f) = \sum_{l=-\infty}^{\infty} \sum_{n=-\infty}^{\infty} k_l m_n \delta(f - f_0 + f_1 - nf_m - lf_m)$$

This again represents a new carrier frequency at $f_0-f_1$ with arrays of sidebands again separated by integer multiples of $f_m$. The series can be rewritten as $$V(f) = \sum_{p=-\infty}^{\infty} c_p \delta(f - f_0 + f_1 - pf_m)$$

where $$c_p = \sum_{n=-\infty}^{\infty} m_n k_{p-n}.$$

Essentially each sideband at $pf_m$ is composed of all possible combinations of frequencies $nf_m + lf_m$ which add up to each $pf_m$. It should be noted that infinite summations are shown in the mathematical treatment. As a practical matter, of course, there are only a finite number of sidebands having a significant amplitude. As a rough rule of thumb, the number of significant sidebands is equal to the number of radians of phase modulation.

Following synchronous detection and integration, as shown in FIG. 3, only the component at the carrier remains. Thus the desired output, representing the density at the value of x determined by K is simply $c_0$ as given by $$c_0 = \sum_n m_n k_{-n}$$

Figure 4:
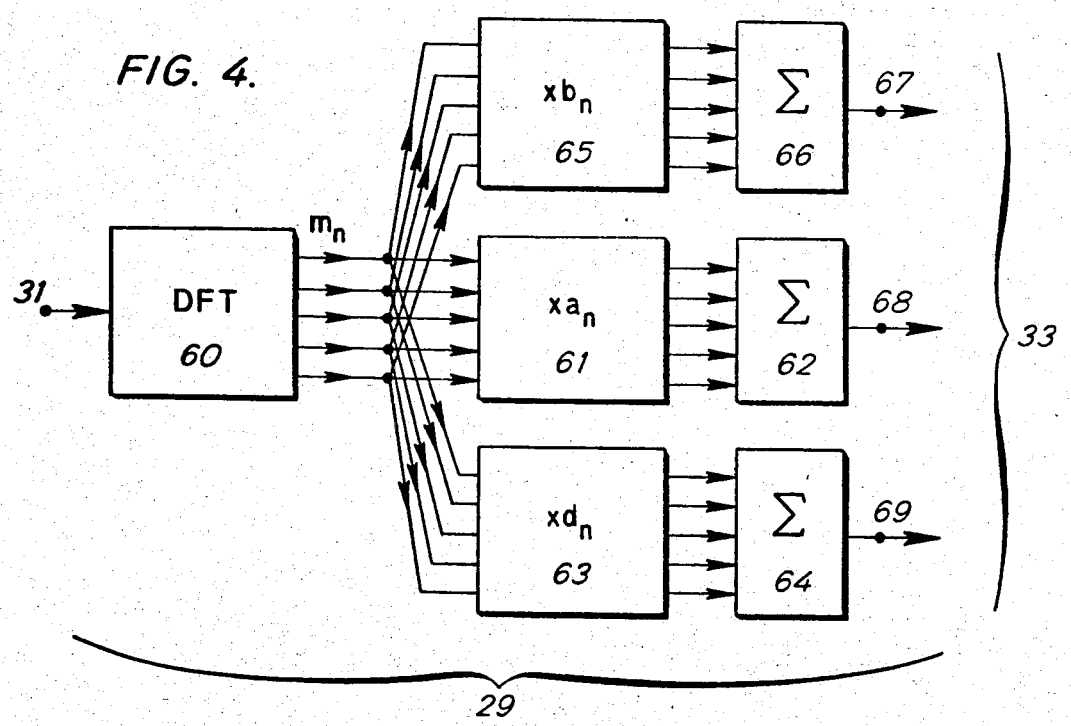
FIG. 4 is a block diagram of a digital embodiment providing processing in two dimensions.

Note that $m_n$ represents the spectra of the received signal 31 and $k_n$ represents the spectra of the heterodyning signal, with different fixed amplitudes of $k_n$ for each x value. We therefore can process the signal as shown in FIG. 4. Firstly, a Fourier transform is taken in DFT 60, a digital Fourier transform structure, to determine the line spectra $m_n$. This could involve taking a direct Fourier transform of signal 31, as shown, although this is a relatively high frequency signal and would therefore require a relatively expensive A to D converter. Alternatively a simply heterodyne mixer can be used to lower the center frequency so that the same spectrum appears at a lower frequency. Also, as is often done in NMR receivers, a pair of synchronous sine and cosine product demodulators can be used to separately extract the real and imaginary parts. These can separately be applied to DFT systems in 60. In any of these examples, a set of line spectra $m_n$ are provided.

The set of constants $k_{-n}$ represent the line spectra corresponding to signal 55 in FIG. 3 and can be precalculated for various phase modulation factors K corresponding to different spatial regions. These precalculated sets of constants are shown in FIG. 4 as $a_n$, $b_n$ and $d_n$, for example. To calculate the response in a particular region, the $m_n$ constants are multiplied by the precalculated $k_{-n}$ constants, such as $a_n$, $b_n$ and $d_n$ in multipliers 61, 65 and 63 respectively. The resultant products, for each set of constants, are summed in adders 62, 66 and 64 to produce output signals 67, 68 and 69 representing the NMR activity in different regions. These, along with similar operations, form output signal 33.

Using complete sets of precalculated weights, the entire operation can be done in parallel. Alternatively, a single product and sum structure can be used with the weights $k_{-n}$ sequentially changed to represent different regions. Also, combinations of parallel and sequential processing can be used as a compromise between hardware complexity and processing time.

This analysis has shown localization in a single dimension, such as a plane. If used with the planar excitation system of FIG. 2, it provides isolation to a line. For isolation to a point, as previously indicated, an additional a.c. gradient is required. As previously discussed, a.c. gradients at angular frequencies $\omega_z$ and $\omega_y$ are used providing the one-sided spectrum of signal 31.

$$M(f) = \sum_{m=-\infty}^{\infty} \sum_{n=-\infty}^{\infty} m_{nm} \delta(f - f_0 - nf_x - mf_y)$$

As previously, the demodulation is accomplished by the frequency domain equivalent of heterodyning using phase modulation factors K and L and integrating the resultant demodulated signal. The heterodyning signal has the form $$V(f) = \sum_{l=-\infty}^{\infty} \sum_{q=-\infty}^{\infty} k_{lq}\delta(f + f_1 - l f_x - q f_y)$$

with the resultant signal having the form $$V(f) = \sum_{p=-\infty}^{\infty} \sum_{r=-\infty}^{\infty} c_{pr}\delta(f - f_0 + f_1 - p f_x - r f_y)$$

where $$c_{pr} = \sum_{n} \sum_{m} m_{nm} k_{p-n, r-m}.$$

For a given $k_{lq}$, representing a given point in space, the integrated signal from that point is given by $$c_{00} = \sum_{n} \sum_{m} m_{nm} k_{-n,-m}$$

providing the desired localization. Again the $K_{-n,-m}$ can be stored for all points in space, if desired. Thus the two-dimensional localization can be realized in the same way as the one-dimensional, using the system of FIG. 4. Here the output of DFT 60 would be a more extensive line spectrum $m_{nm}$, requiring more output numbers. Also each multiplying set of stored weights, such as 61, 63 and 65, would now be more extensive. In both cases, the one and two-dimensional localization, the basic operation involved is the multiplication of a column vector spectrum $\overline{m}$ by a stored matrix $\overline{k}$ where the rows of k each represent the stored weights for a different point in space as given by $$\overline{p} = \overline{k}\overline{m}$$

where $\overline{p}$ is the vector representing the density or similar image.

A more computationally efficient processing system involves separately processing each of the two dimensions. For example, modifying the system of FIG. 3, two cascaded multipliers or mixers can be used, each followed by filters tuned to the difference frequency. The first mixer, such as 50, has a heterodyne signal 55 phase modulated by $K \sin \omega_x t$ with the second mixer phase modulated by $L \sin \omega_y t$, rather than both in a single mixer. In this way phase modulation factor K can be set for the desired x localization, with L varied to cover all the y values along the selected x line. Alternatively a parallel array of second mixers, each with a different L value, can be used following the first mixer. In this way, once an x value is selected with K, all of the corresponding y values are read out simultaneously. Thus the first mixer is sequenced through the x values, with the array of second mixers supplying all of the y values.

This general system of separately processing the x and y coordinates for computational efficiency can be wholly or partially using digital Fourier transforms. For example, referring to FIG. 3, again assume that mixer 50 is used to select a single dimension, x or y, by applying either $V_3$ or $V_5$ to signal generator 51. Again, the amount of phase modulation will govern the particular line chosen along that coordinate. The second dimension can then be selected as shown in FIG. 4. The output of demodulator 53, signal 57, has its center frequency or $J_0$ component determined by the selected coordinate, such as might be determined by L if $V_5$ alone is connected to generator 51. The sidebands surrounding this $J_0$ component represent the various x values.

Signal 57 is then applied to DFT 60 in FIG. 4. This DFT extracts the $\omega_x$ sideband amplitudes $m_n$ and operates on them with fixed multiply and sum structures, as previously described, to extract the array of x values corresponding to the y value chosen in generator 51. Again, by sequencing through the y values, and obtaining the array of x outputs for each y value, the image is formed.

The two-dimensional processing operations are simplified if the gradient modulation signals have the same frequency but are orthogonal in phase so that the x gradient signal $V_3$, segment 42, is of the form $\sin \omega_m t$ and the y gradient signal, $V_5$, segment 44, is of the form $\cos \omega_m t$. In that case the heterodyne multiplying signal 55 of FIG. 3 becomes $$v = \exp\{i\omega_1 t + iK \sin \omega_m t + iL \cos \omega_m t\}$$

Figure 5:
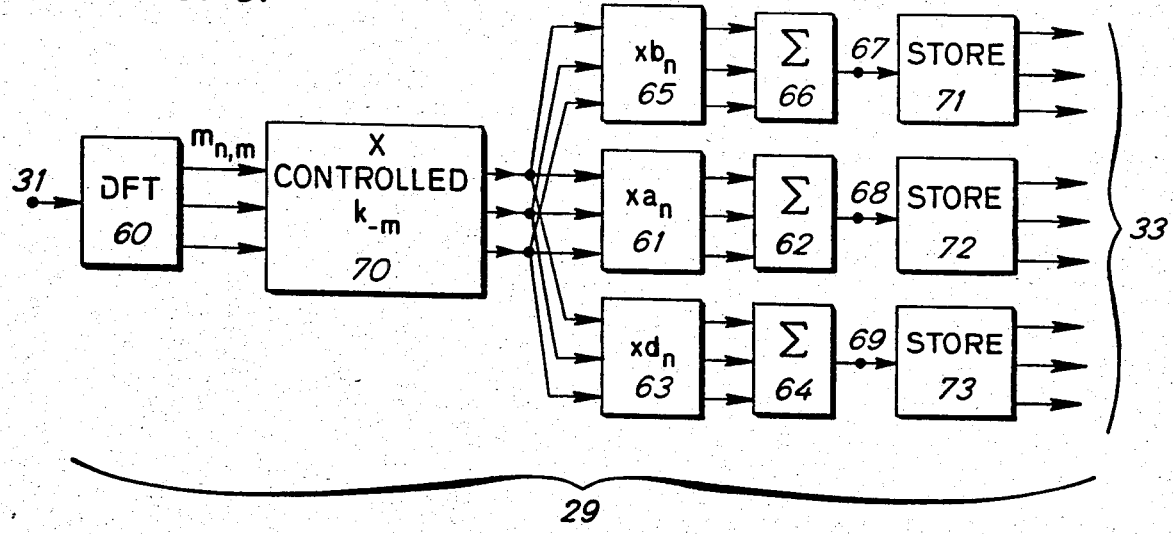
FIG. 5 is a block diagram of a digital embodiment providing processing in two dimensions.

Again, this can be implemented as two successive mixing operations with the x line selected first, based on the value of K, and then the y line either also selected in sequence or through a fixed bank of parallel mixers representing the different values of L for the y positions. This latter concept forms the basis of a simplified digital implementation as shown in FIG. 5.

Here the signal is again Fourier transformed using any of the alternative methods previously suggested to provide the coefficients $m_{nm}$ of the line spectrum. This spectrum is again lines separated by frequencies $f_m$ only, since that is the only phase modulation frequency used. The resultant line spectra are multiplied by multiplier 70 containing an array of controlled weights $k_{-n}$. These are adjusted to represent any individual y line corresponding to different phase modulation factors L. Following the y selection is the same parallel x selection system of FIG. 4. The fixed weights in multiplier 61, 65 and 63 each select an x value to complete the two-dimensional image. Each x output, 67, 68 and 69 corresponds to the specific y line being selected by the selected set of $k_{-n}$ values in 70. One way of creating the desired two-dimensional image is to store outputs 67–69 in storage structures 71–73 for each y value or $k_{-n}$ value. Thus, as 70 is sequenced through m y values, each of the n fixed multipliers provides a stored output. The resultant $n \times m$ array of numbers 33 represents the two-dimensional image.

Many variations on this theme can be used including many combinations of heterodyne mixers for coordinate selection, either in sequence or in parallel. A complete parallel system can be produced, where each y selection at each y position is followed by an array of x selectors, both either using heterodyne mixers or the digital implementation of FIG. 4. Alternatively, all or part of the system can be sequenced through the coordinates, using the stored signal 31.

The system as described provided imaging of planar region 28 of volume 10. To image the entire volume, referring to FIG. 2, the operation is repeated with a different frequency for burst 40. Alternatively, as previously indicated, burst 40 can be used to excite the entire volume 10 with a.c. gradients used at all three axes, $V_2$, $V_3$ and $V_5$, with signal 31 stored. In this way any point in the volume can be studied or imaged using the single recorded signal 31. Combinations of the processing arrangements shown in FIGS. 3, 4 and 5 can be used to image the entire volume. For example, using FIG. 3, two of the three coordinate axes can be selected representing a line in volume 10. Signal 57 can then be applied to DFT 60 in FIG. 4 to simultaneously image each point in that line. Alternatively a system can be used where two of the axes, for example the x and y axes, have their gradients again modulated by sine and cosine versions of the same frequency. The third axis, the z axis, requires a different frequency. Firstly, the system of FIG. 3 can be used, using only $V_2$, the a.c. gradient signal in the z axis, driving signal generator 51. Again the amount of phase modulation in signal 55 determines the selection of the z plane. Signal 57 is then applied to DFT 60 in FIG. 5 to extract the x and y values as previously described.

In the previous reference to British Pat. No. 1,601,816 to Waldo Hinshaw a sensitive line method was described where a.c. gradients are used in two axes to localize to a line, with frequency decomposition providing the points along the line. This general approach can also be used with this invention where again, using the unique processing methods described, all points can be imaged with a single acquisition. Again referring to FIG. 2, assume pulsed gradient 42 is removed and burst 40 excites the entire volume 10. A pulse is used as the z gradient $V_2$, which coincides in time with the FID signal 41. This effectively means that each z value effectively corresponds to a different frequency. The processing can take place as in FIG. 3 where the x and y values are selected by K and L, thus selecting a line. Integrator 54 becomes a low-pass filter which cuts off the $\omega_x$ and $\omega_y$ sidebands, but includes the frequency variations along z. The output of this low pass filter is then Fourier transformed to provide an array of z values along the selected x,y line. Again, by sequencing through K and L, the volume is imaged. Quadrature signals of the same frequency can again be used for $V_3$ and $V_5$. Various degrees of parallelism can again be employed using either heterodyne mixers or the previously described digital implementation.

In this method of implementation the range of frequencies due to the static z gradient signal $V_2$ must be lower than $\omega_x$ and $\omega_y$ since they are separated by filtering. This however, is not a basic requirement. For example, referring to FIG. 3, the heterodyne mixer or multiplier signal 55 can be of the form $$v = \exp\{i\omega_1 t + iK \sin \omega_x t + iL \sin \omega_y t + iRt\}$$

corresponding to the gradient modulation where the x and y axes receive sinusoidal gradient modulation and the z axis receives a static gradient. Here, by selecting K, L and R in signal generator 51, any point in space can be imaged. This processing method, or methods analogous to it, are not subject to the restriction that the frequency range due to the z gradient be less than the frequency of the a.c. gradient signals.

The various heterodyne mixers, for convenience, have been shown at a frequency $\omega_1$. However, as previously indicated, sine and cosine demodulators are used to extract the real and imaginary parts of the signal. Another equivalent approach is to use the phase modulated signal as the sine and cosine demodulators to avoid the additional heterodyne operation. This equivalently renders $\omega_1$ equal to the carrier frequency $\omega_0$ so that the output becomes a baseband signal.

The heterodyne operation has been shown, for simplicity, as an analog multiplication. This can be implemented as a sampling operation, which is the equivalent of heterodyne multiplication. Thus the received signal is sampled by a phase-modulated sampling signal. In this way the heterodyne operation can also be implemented using digital hardware.

As an example, heterodyne signal generator 51 in FIG. 3 can be operated directly at the frequency $\omega_0$ using a signal $\cos \omega_0 t$. This eliminates demodulator 53 and directly provides signal 57. Also heterodyne multiplier 50 can be a pulsed sampler with signal generator 51 supplying phase modulated pulses 55.

The system as shown in FIG. 2, and as discussed thusfar, provided images of primarily spin density since the FID amplitude of signal 41, $m_0$ is proportional to spin density and the processing provides proportionality to $T_2$. However, all of the desired NMR parameters including relaxation times $T_1$ and $T_2$ can also be studied using these same general processing techniques which enable the entire volume to be studied with a single acquisition. Thus the method of excitation and reception of the signal determines the particular NMR parameters being imaged. If sensitivity to $T_1$ is desired, the burst 40 in FIG. 2 can be preceded by a 180° inversion excitation providing a proportionality of the form $(1 - 2e^{-\tau/T_1})$ where $\tau$ is the interval between the inversion excitation and the 90° excitation, signal segment 40. Similarly $T_2$ sensitivity can be realized by a spin echo excitation where, following a 90° excitation, a 180° inversion excitation is used providing a proportionality factor $e^{-2\tau/T_2}$. Data can be obtained using different excitation sequences and combined and processed to isolate spin density, $T_1$ and $T_2$ using the appropriate mathematical operations as are now used in cross-sectional imaging systems.

One of the significant advantages of the processing system described in this invention is that of SNR (signal-to-noise ratio). If all the points of a plane or volume being imaged are acquired in sequence, only a limited amount of time can practically be devoted to each point, thus degrading the SNR due to limited integration time. However, using the concept of this invention, we make use of the fact that all points are simultaneously contributing to the output signal. Therefore, a given acquisition time interval corresponds to all points in the plane or volume, thus greatly improving the SNR.

These longer acquisition times correspond to some form of repeated excitation. One method of repeated excitation, which has often been used with the sensitive point imaging system using a.c. gradients, is the Steady-State Free Precession excitation system which is described in most of the previously listed references and is analyzed in detail in the previously referenced book by P. Mansfield and P. G. Morris. Here excitations are repeated in a time interval shorter than $T_1$ and $T_2$. The resultant signal, which is in effect a combination of FID's and spin echoes, can be made to have a relatively high, almost continuous amplitude which is optimal for SNR considerations. Another method of repeated excitations, which also avoids the problem of waiting for times comparable to $T_1$ and thus significantly lengthening the data acquisition time, is Driven Equilibrium, also described in the same book by Mansfield and Morris. Here spin echoes are produced by the usual 180° pulse following a 90° pulse. However, at the peak of the spin echo signal a 90° burst is used to rotate the magnetic moment back along the z axis so that a new excitation can begin immediately. Another method of repeated excitations, again for improved SNR, provides a series of spin echoes using a sequence of 180° inversion bursts following a 90° burst. This provides signals for the duration of the $T_2$ exponential, rather than the comparatively short duration of $T_2^*$.

During these repeated excitations the a.c. gradient signals can be structured in a number of ways. As previously indicated, the a.c. gradient signals can be synchronous or asynchronous with the excitations, which determines whether the response is of the form $J_0$ or $J_0^2$. Also, the a.c. gradient can be interrupted during the excitation bursts, as shown in FIG. 2, or run continuously. In cases where broadband excitation bursts are used to non-selectively excite the entire volume, the gradients can keep running. Using various selective excitations, however, the a.c. gradients should be disabled during the burst. They can either simply be disconnected during the short excitation period and then turned back on, or they can be turned off and then restarted at the same phase they were at when turned off.

Although the excitation system has some effect on the spatial response, as indicated by the previous reference by Katherine N. Scott, the response is primarily dominated by the $J_0$ or $J_0^2$ functions previously described. In some cases this impulse response or localization function may prove inadequate. However, using the unique properties of the heterodyne imaging system, or its digital equivalent, great flexibility can be achieved in the response function. Basically, referring to the previous analysis, the phase modulation factor $e^{iA \sin \omega t}$ represented a sum of Bessel functions of the form $$\sum_n J_n(A) e^{in\omega t}.$$

Following integration, as previously described, only the $J_0(A)$ term remains since it is not time varying. However, if before integration we multiply this signal by another of the form $e^{-ik\omega t}$ and then integrate we then provide an output of the form $J_k(A)$. Note that we can select k to achieve a Bessel function of any order. This is particularly valuable since combinations of Bessel functions can be combined to achieve a wide variety of desired responses.

Figure 6:
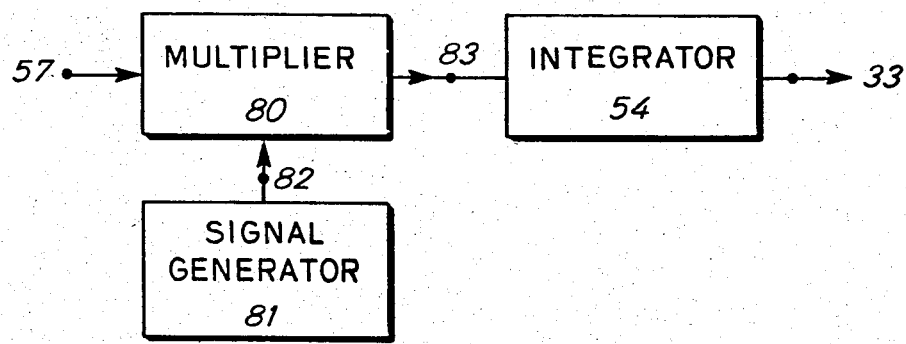
FIG. 6 is a block diagram of an embodiment providing improved resolution.

A representative embodiment to achieve this is shown in FIG. 6. Here the demodulated signal 57, from FIG. 3, is additionally processed prior to integration by multiplying it by signal 82. In its most general form signal 82 can be of the form $$\sum_n a_n \cos n\omega_m t + b_n \sin n\omega_m t$$

where $\omega_m$ is the gradient modulation frequency and $a_n$ and $b_n$ are constants which are chosen to provide some desired response. For example if $a_0 = 1$ and all other constants are zero, the system will be unchanged and essentially retain its $J_0$ or $J_0^2$ response characteristic. As other frequencies are used, with different weightings, higher order Bessel functions are combined to provide a wide variety of responses. One simple example is illustrated by the Bessel function identity $$\frac{J_1(x)}{x} = \frac{1}{2}[J_0(x) + J_2(x)]$$

Note that $J_1(x)/x$ is the classic diffraction-limited response which is considered a good localization function because of its relatively narrow central lobe and relatively small sidelobes. This response is achieved through a combination of a $J_0$ function and a $J_2$ function. Thus if signal 82 is of the form $1.0 + e^{j2\omega_m t}$, following integration the resultant localization will be of the form $J_1(x)/x$ and thus be significantly improved.

The aforementioned example was for the case where asynchronous averaging is not done, so that the responses are of the form $J()$ rather than $J^2()$. If asynchronous averaging is done the choice of constants will enable the generation of a response of the form $$\sum_n a_n J_n^2(\gamma G y / \omega_m)$$

where the $a_n$ are chosen in signal generator 81. Again, a wide variety of responses can be achieved using selected values of $a_n$. The nature of the responses is a subject known as "$J^2$ synthesis" and is described in a paper by J. Ruze, "Circular Aperture Synthesis," *IEEE Trans. on Antennas and Propagation*, AP-12, 1964, pp. 691–694.

The implementation in FIG. 6 is shown for a single gradient modulation in one axis. For multiple axis a.c. gradient modulation, a set of harmonic frequencies of the form $c_n e^{in\omega_y t}$ and $d_m e^{im\omega_z t}$ is used for each axis. Thus, by selecting the constants, the desired responses are provided in each axis. Also, FIG. 6 shows the operation performed on the "baseband" signal after demodulation by demodulator 53. This same operation can be formed in signal 56, prior to demodulation, thus essentially eliminating the demodulator. Here the multiplying signal is of the form $$\sum_n a_n e^{i(n\omega_m t + \omega_c t)}$$

where $\omega_c$ is the carrier frequency at that point. Again, the desired sidebands in their correct amounts are heterodyned to zero frequency and appear in the output of integrator 54.

FIG. 6 represents a time-domain implementation of this system for selecting the desired spatial response. It can also be implemented in the frequency domain in a system similar to that of FIG. 4. Repeating a previous result, after heterodyning the one-sided line spectrum was of the form $$V(f) = \sum_p c_p \delta(f - f_0 + f_1 - p f_m)$$

where $$c_p = \sum_n m_n k_{p-n}$$

where m is the line spectra of the received signal 31 and k the line spectra of the heterodyning signal 55 used to select a local position in space. To achieve the $J_0$ response, representing integration, we used $$c_0 = \sum_n m_n k_{-n}$$

To achieve the $J_l$ response we simply use $$c_l = \sum_n m_n k_{l-n}$$

Figure 7:
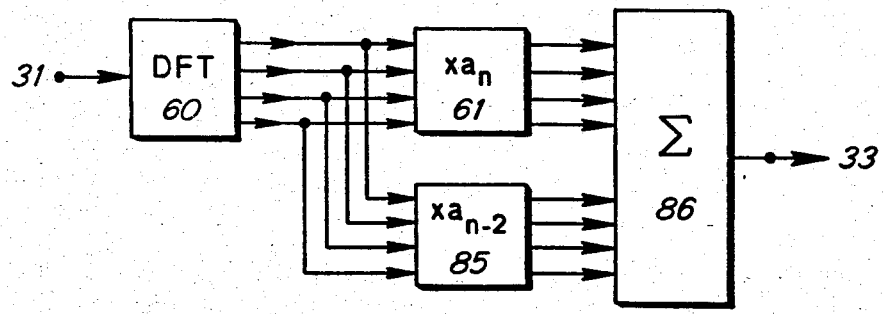
FIGS. 7 and 8 are block diagrams of digital systems providing improved resolution.

This is illustrated in FIG. 7. Here the Fourier transformed outputs $m_n$ are applied to multiplier 61 as before to provide the $J_0$ or $J_0^2$ response. In addition, however, they are also applied to the same weights shifted by two in multiplier 85 to achieve the $J_2$ or $J_2^2$ response. Any combination of these two sets can be added in adder 86 to achieve the desired output as previously discussed. Note that FIG. 7 is basically a single operation, although two sets of multiplying constants are shown. It is the equivalent of each weighted multiplier $a_n$ in 61 receiving the sum of two inputs, $m_n$ and $m_{n+2}$. Thus the basic system of FIG. 4 can be appropriately modified by applying a number of $m_n$ components, appropriately weighted, to each $k_{-n}$ in each of the multiplying structures 61, 65 and 63. This is simply illustrated in FIG. 8 where the outputs of DFT are first combined using weights 87 which simply take a fixed fraction of each $m_n$ component and add it to the $m_{n+2}$ component. These are then weighted and summed in 61 and 62 as before. This accomplishes the equivalent of FIG. 7.

Figure 8:
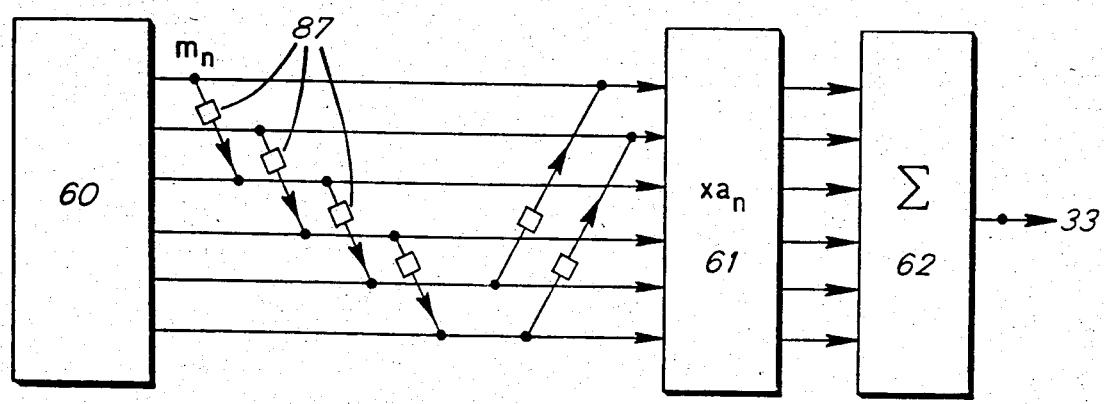

The use of these additional components can, as in the previous cases, be used in a wide variety of embodiments using various combinations of the systems of FIGS. 6, 7 and 8 for the various dimensions. For example, using a planar system where a single plane is excited and two a.c. gradients are used to image within the plane, the system of FIG. 6 can be used to provide the higher order terms to improve the x resolution while that of FIGS. 7 and 8 used to improve the y resolution. Thus the x values, corresponding to each line in the plane, would be addressed in sequence. The y values would be processed simultaneously, as in FIG. 4, where each box in FIG. 4 would be modified as in FIG. 8.

As previously indicated, this general heterodyne or multiplying processing system can be used, following a simultaneous acquisition, to derive information about the NMR activity of all points in a region. Predating NMR imaging, spectroscopy has long been one of the most significant modalities available. In biological considerations the NMR spectrum of materials such as $^{31}P$, an isotope of phosphorus, has profound significance in the study of metabolism and related diseases. These spectra are much finer than those previously discussed, requiring frequency resolutions of about one part in $10^6$. As was indicated in the previously referenced paper by Katherine N. Scott, the sensitive point method using a.c. gradients is presently used to study the spectra of $^{31}P$ and other materials in assessing disease. It is, however, an extremely awkward system since the data is acquired for each point separately. It is therefore laborious to locate regions of interest and the patient is involved for very long periods of time. More important, it is completely impractical to envision images representing these important spectra using existing techniques.

However, the system described thusfar can be used to provide NMR spectral information of all points in a region following a single set of excitations, as would usually be used for a single point in the sensitive point system. Again referring to FIG. 3, using the frequency $\omega_0$ corresponding to the Larmor frequency of the material of interest, a Fourier transform system can be added to the output of Integrator 54. Integrator 54 becomes, in effect, a low pass filter which removes all of the sideband information from the gradient modulation and leaves the very narrow NMR spectrum of the material being studied.

Figure 9:
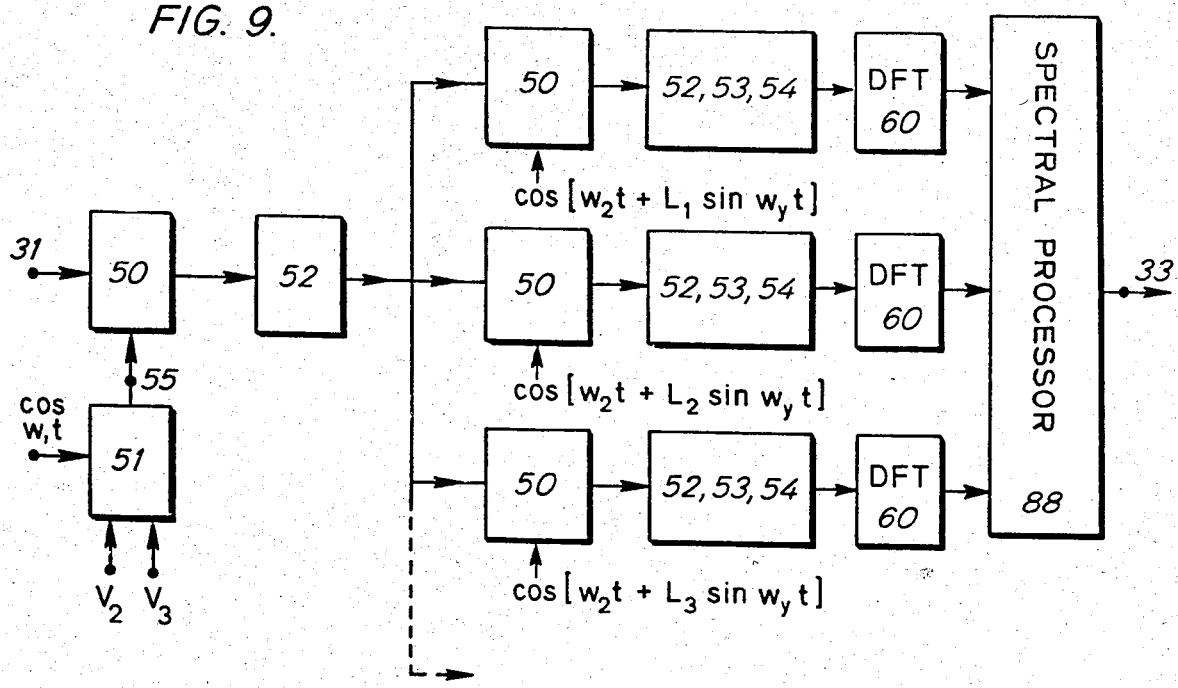
FIG. 9 is a block diagram of an embodiment for simultaneously providing spectral data for a plurality of points.

One method of utilizing the invention for spectral studies is to record the output signal 31 in the presence of three appropriately orthogonal a.c. gradient signals. Then an NMR spectrum can be obtained from any point in the volume by applying controlled amounts of all three gradient signals, $V_2$, $V_3$ and $V_5$ to signal generator 51. The clinician therefore simply dials in the x,y,z position by adjusting the amounts of phase modulation K, L and P as previously described, and observes the NMR spectrum from the Fourier transform of the output of 54. These parameters could be sequenced automatically, with the spectral values stored, to create an image which, for example, represented metabolic function. Specific aspects of the spectral lines, such as their relative amplitudes can be derived and used to provide monochrome or color displays of the region. To speed up the process, various degrees of parallelism can be used as shown in FIG. 9.

Here signal 31 is first operated on with mixer 50 as previously described to isolate a specific line in the volume. Appropriate amounts of phase modulation from the $V_2$ and $V_3$ signals isolate specific x and z values to define the line. Following filter 52 an array of parallel mixers 50 are used to simultaneously provide each y value of the isolated line. These mixers are again driven by phase modulated signals, each with a different value of phase modulation L, defining a y coordinate. Each output is again filtered demodulated and integrated by the boxes marked 52, 53, 54 to indicate the sequence of functions. To find the NMR spectrum of each y value in the isolated line digital Fourier transform structure 60 is used. Spectral processor 88 derives relevant information from the individual spectra to provide for a display. For example in a $^{31}P$ NMR spectrum, following ischemia, the phosphocreatine peak drops in amplitude while the inorganic and sugar phosphate peaks increase. Thus processor 88 could extract the amplitude of these three peaks for a color display indicating local metabolism. Alternatively processor 88 could take the ratio of the phosphocreatine to the sum of the inorganic and sugar phosphate peaks for a single number representing local physiology.

To create a planar image, for example, $V_3$ can be sequenced through its various corresponding x values providing an image of the plane corresponding to the z value determined by $V_2$. Thus any plane can be examined. The parallel processing can be accomplished digitally as in FIG. 4. However, the Fourier transformation will be more complex since, for each line in the spectrum resulting from the gradient modulation, we now have the array of closely spaced lines corresponding to the NMR spectrum. Thus, as in FIG. 4, each $m_n$ line becomes an array of line spectra which are then weighted by the subsequent multiply and add operations. However, for ease in computation, only the important and relevant spectral lines need be preserved. For example, with a $^{31}P$ spectrum, for many studies only 2–4 line amplitudes define the physiology of interest. Thus DFT 60 in FIG. 4 would have, for example, 3 lines for each $m_n$. Each of the three are multiplied by the same $k_{-n}$ constant in the subsequent structures 65, 61, and 63, providing outputs 67, 68 and 69 of the three lines or some predetermined function of these spectral lines. Again, for improved spatial localization of the NMR spectrum the methods of FIGS. 6, 7 and 8 can be used to isolate the higher order terms and use them, as discussed, to improve the resolution.

In addition to the various NMR properties discussed, blood flow represents an important diagnostic parameter which NMR systems can study. Using a.c. gradient modulation followed by flexible heterodyne processing, as introduced in this invention, blood flow of an entire region can be studied. In U.S. application 332,925 now Pat. No. 4,528,985 by the same inventor the concept of NMR projection imaging of vessels was introduced where angiographic images are formed of moving materials. Improved versions of projection imaging of vessels were disclosed in U.S. application 466,969 now Pat. No. 4,565,968 by the same inventor indicating methods of providing the projection over specific regions and isolating venous and arterial flow. Three basic methods of NMR blood flow imaging introduced by U.S. application Ser. No. 332,925 can be used to advantage in this invention. These include: temporal substraction, inversion excitation and excitation of adjacent regions.

In temporal subtraction we take advantage of the fact that NMR signals are a function of velocity since the moving material receives different degrees of excitation. Therefore, referring to FIGS. 2 and 3, images may be made at two different portions of the heart cycle as discussed in U.S. application Ser. No. 332,925. Thus burst 40, using the patient's electrocardiogram, can first be timed to coincide with the systolic region where the blood velocity is high. After that data is acquired an additional data acquisition interval is used with burst 40 coinciding with a time interval when the velocity is low. A substraction of the two sets of processed data will therefore isolate the moving blood in vessels.

A variety of processing approaches can be used with this general theme based on the previously described imaging systems. For example, using three a.c. gradients, covering all axes, where burst 40 excites the entire volume, each point or voxel in the volume can be reconstructed. The subtraction operation would then provide the blood velocity at each point in the volume for flow studies. Given all of the three-dimensional flow information of volume 10 a variety of images can be created including projection images in any direction of any desired portion of the volume to display the vessel anatomy and look for narrowings. Also, cross-sectional images can be displayed indicating the blood velocity at each point in the section.

Alternatively, as in U.S. application Ser. No. 332,925, the projection information only can be acquired to simplify the processing. For example only two a.c. gradients can be used, such as in the x and z dimensions, to provide line integral or projection information in the y dimension. Again, burst 40 is used to excite the entire volume without any planar selection. Using only two a.c. gradient signals, $V_2$ and $V_3$, the acquired information represents a projection in the y direction. After processing, as in FIG. 3, and subtraction of the projection images taken at different times in the ECG cycle, an image of the vessels is formed. Because the entire volume is excited and acquired simultaneously, this system will have superior SNR to the previously described blood vessel projection imaging systems which acquire the data as a sequence of planes.

These same general comments apply to the other approaches to blood vessel imaging. For example, assume burst 40 represents a broadband 180° inversion excitation covering disjoint regions of the spectrum. As discussed in U.S. application Ser. No. 332,925, the frequency spectrum consists of a repetitive comb of regions which are excited interleaved with regions which are not excited where the excited regions experience a 180° inversion excitation. Because of z gradient 43 these different excitation regions correspond to different z planar sections. Because of the inversion excitation, all static material will produce no signal. Flowing blood however, moving between excited and unexcited planar sections, will experience less than a complete inversion and thus produce FID signals 41. As previously discussed, either three a.c. gradients can be used to process the entire volume or two a.c. gradients can be used to process projection images only. Again, if three a.c. gradients are used, flow information can be derived from any point, or flow projection images can be made in any direction of any region. This approach has the advantage over the previously described projection imaging system using temporal subtraction in that the flow information is derived from a single acquisition. This avoids possible motion artifacts due to respiratory motion, etc. and also enables the study of various flows, such as venous flow, which have a very small pulsatile component and have relatively constant velocity. Although a single 180° inversion excitation has been described, as indicated in U.S. application Ser.No. 332,925 a dual burst system can be used, such as two bursts of approximately 90° each, to again insensitize static material.

To avoid the problem of obtaining near exact inversion excitations in an array of sections, the third approach can be used. Here again the volume is excited in layers. However the excitation is approximately 90° excitation and is relatively non-critical. Thus the excitation spectrum of burst 40 is the same as previously described except halved in amplitude to provide 90°, rather than 180°, excitation of alternate layers or planar sections. Following data acquisition, the processing system studies only those unexcited regions between the excited sections. For example, the P values in the phase modulation of the heterodyne signal in the z direction are chosen to represent only those values between the excited z planes due to the spectrum of burst 40. All static material will cancel out since these are unexcited planes. However, moving blood flowing from the excited sections to the unexcited sections will provide the desired output image. As before 3D flow information can be derived or projection images can be obtained of vessels.

Some static anatomy may appear in the flow images because of overlap in the excited and unexcited sections. Since the resolution of the excitation and receiving functions are not ideal, some overlap is inevitable. This can be counteracted by imaging the excited sections themselves to obtain image information of the static anatomy. Some fraction of this can then be subtracted from the flow image to remove the residual static image and provide an isolated vessel image. Also, the static and flow images can be combined in interesting displays, such as in color, as disclosed in the previously referenced applications on flow imaging. In this invention, however, the static and flow image information from the entire volume is derived simultaneously with the a.c. gradients and heterodyne processing enabling all of the image data to be subsequently derived.

Although the method described for flow imaging indicated the excitation of an array of planar sections, alternatively this can be an array of lines or an array of dots using various excitation systems such as a.c. gradients in the presence of the excitation signals as described in Mansfield's echo-planar system.

In addition to the projection imaging of vessels, generalized projection imaging can be accomplished as indicated in U.S. application No. 332,926 now Pat. No. 4,486,708 by the same inventor. As disclosed in that application and a subsequent application with the same title, projection measurements are taken which are sensitive to different NMR parameters. These are then combined to provide selective projection images which enhance or cancel specific materials. Since these are projection images they simultaneously provide information about the entire volume. For example, for mass screening, a projection image of the entire abdomen or head can be made which isolates tumors and suppresses all other materials.

In the previous applications the projection image was obtained in sequence. Using the a.c. gradient and heterodyne processing techniques described herein the entire volume can be acquired simultaneously with improved SNR. Also, additional NMR parameters associated with NMR spectroscopy, as previously disclosed, can be used to provide greater material selectivity. In addition, again using the spectrographic data, selective projection images can be made indicating specific physiologic characteristics such as ischemia. As before, either one, two or three a.c. gradients can be used in the acquisition process. Projection images can therefore be acquired directly or created in any direction from the three-dimensional processed information.

In all of the studies thusfar sinusoidal waveforms were used to provide the a.c. gradient signals. These are preferable from a hardware viewpoint since they are relatively simple to generate. Also, through the use of resonant circuits, they can be used with relatively low power. This is preferable to the square wave gradient signals used with the previously referenced echo-planar system of P. Mansfield.

However, the general system described whereby all points can be imaged is not limited to the use of these sinusoidal waveforms. A general gradient modulation waveform G(t) can be used as indicated below where $$\frac{\partial m}{\partial t} = -m\{i\omega_0 + i\gamma x G(t) - t/T_2\}$$

where the gradient G is in the x direction for illustrative purposes $$m = m_0 \exp\left\{-i\omega_0 t - i\gamma\chi \int_{t_1}^{t_1+t} G(t)dt - t/T_2\right\}$$

$$= m_0 \exp\{-i\omega_0 t - i\gamma\chi D(t) - t/T_2\}$$

where $$D(t) = \int_{t_1}^{t_1+t} G(t)dt$$

If G(t) is periodic with angular frequency $\omega_m$ and m(t) is demodulated and integrated, as previously pointed out, the localization function is of the form $$\sum_{n=1}^{\infty} J_0^2\left(\frac{\gamma g_n \chi}{n\omega_m}\right)$$

where the $g_n$ values are the harmonic content of the periodic waveform G(t) whose fundamental angular frequency is $\omega_m$. However, using a heterodyne signal 55 of the form $$v = \exp\{i\omega_1 t + iAD(t)\}$$

results in a filtered heterodyned output signal 56 of the form $$v = m_0 \exp\{-i(\omega_0-\omega_1)t + i(A-\gamma x)D(t) - t/T_2\}$$

When demodulated and integrated, as before, this provides the same $J_0^2$ spatial response as before except centered at $x=(A/\gamma)$. Thus the choice of A, the phase modulation index of the non-sinusoidal signal, again determines the desired localization.

It is important to realize that the gradient signal G(t) and its associated integral D(t) need not be periodic. The previous analysis applies equally well to non-periodic gradient modulation. For example, gradient signals $V_3$ and $V_5$ in FIGS. 2 and 3 could be random noise signals which are orthogonal. The heterodyne or multiplying signal 55 would then be a carrier frequency phase modulated by the integral of $V_3$ and $V_5$ where, as before, the depth of the phase modulation would determine which point is being isolated. Also, these non-periodic gradient systems can be used with the previously described applications to NMR spectroscopy and flow.

Figure 10:
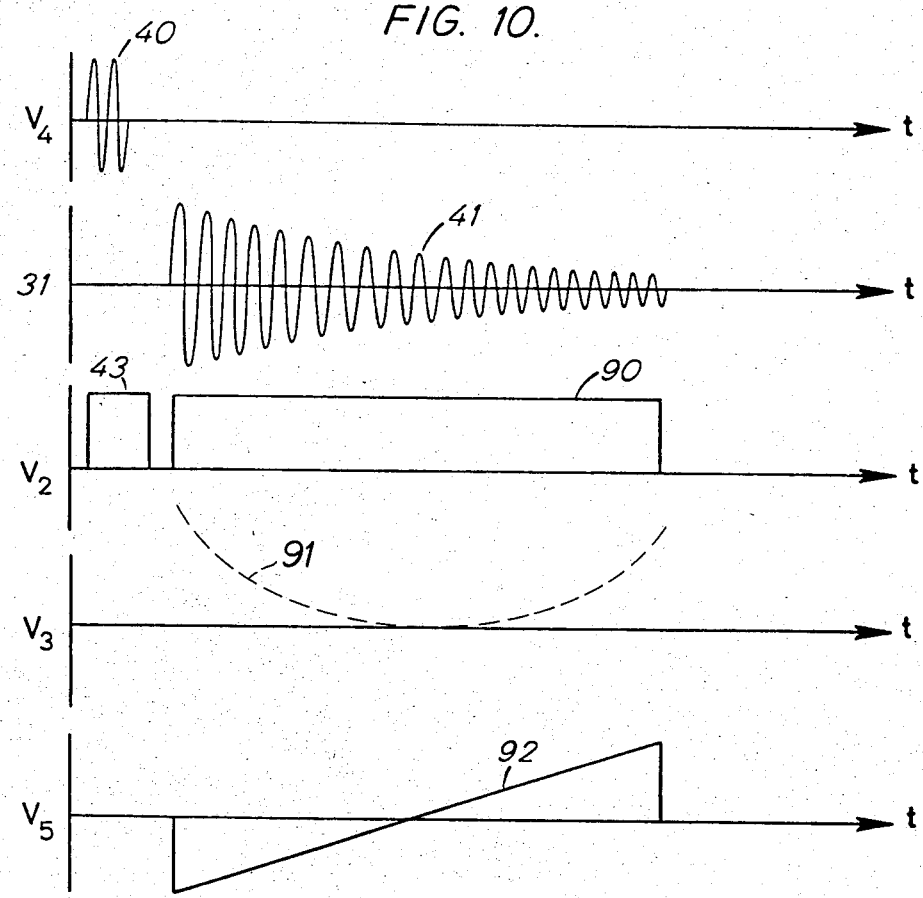
FIG. 10 is a set of waveforms illustrating an embodiment of the invention using aperiodic grating modulation.

One particularly interesting non-periodic embodiment is illustrated in FIG. 10. Initially, we assume the r.f. excitation, $V_4$, consists of a broadband burst represented, as before, by signal segment 40. This serves to excite the entire volume. This could also be accomplished by a narrow band burst in the absence of z gradient signal segment 43. While the FID, signal segment 41, is being received the x and y gradients $V_3$ and $V_5$ are subjected to parabolic and ramp functions 91 and 92. These provide frequency changes which vary with time. The ramp function results in a quadratic phase function which is the classical "chirp" pattern used in many applications because of their desirable properties. One of these desirable properties is a sharp autocorrelation peak which aids in decoding. The z gradient $V_2$ is a constant, signal 90, so that each z plane is encoded as a different frequency as in the previously referenced sensitive line system. This provides a signal 31 of the form $$m = m_0 \exp\{-i\omega_0 t - i\gamma Z x t^3 - i\gamma W y t^2 - i\gamma V z t - t/T_2\}$$

Any point in space can be isolated using a heterodyne signal 55 of the form $$v = \exp\{i\omega_1 t + iAxt^3 - iByt^2 - iCt\}$$

where A, B and C determine the x, y and z coordinates of the isolated point in space following integration.

Figure 11:
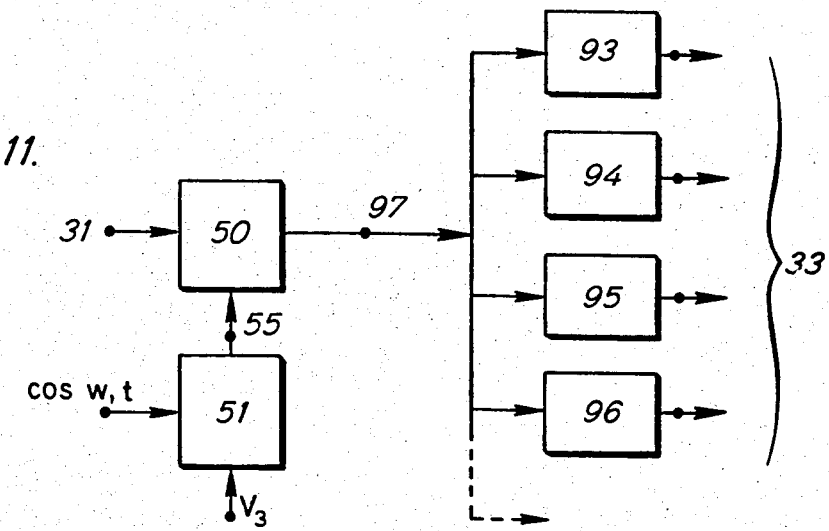
FIG. 11 is a block diagram of an embodiment using aperiodic modulation.

As previously described, a variety of parallel processing can be used tosimplify and speed up the decomposition of signal 31 into the three-dimensional imaging information. One interesting embodiment is shown in FIG. 11. Here a heterodyne mixer initially selects a particular x value where signal 55 is of the form $$v = \exp\{i\omega_1 t + iAxt^3\}$$

where A determines the x plane. To decompose the selected plane into y and z values an array of chirp convolvers or correlators 93–96 are used. These are widely used in signal processing and can either be SAW (surface acoustic wave) devices or CCD (charge-coupled devices), or be digitally implemented. In each case signal 97 is convolved with a quadratic phase factor of different amplitudes of the form $\exp\{-iByt^2\}$ where each block, 93–96, has a different value of B.

The output of each block will therefore represent a different value of y. However, since each z value represents a different frequency, the time of each output will determine the z value. Thus each of the outputs 33 represents a particular y value with a sequential array of z values, thus filling the chosen plane. By changing A in signal 55, any plane can be selected.

The method described in FIGS. 10 and 11 has involved simultaneous acquisition of the entire volume 10. If single planes are to be acquired, burst 40 can be narrow band, exciting only the desired z plane. In that case z gradient signal 90 is removed with functions 91 and 92 encoding the x and y positions of the plane. The decoding is the same, without the z function.

As previously indicated any non-periodic orthogonal functions can be used for the time-varying gradient signals. The signals shown in FIG. 10 are simple examples of orthogonal polynomials. A wide variety of other polynomials can be used for the modulation functions as long as they are properly orthogonal.

Many other combinatorial embodiments can be structured on this same basic theme. In general the sensitive point method, as proposed by Hinshaw has been used only to image the null region. In this invention, novel processing methods have been shown where all regions of interest can be imaged from a single data acquisition sequence. The heterodyne processing method essentially derives processed image points from arrays of spectral data. This is in sharp distinction to the echo-planar system of P. Mansfield where each image point is derived from a specific part of the frequency spectrum, resulting in a relatively restricted system. Thus the data from each image point, in this invention, is derived from a plurality of components of the frequency spectrum. In the periodic case, these are separated by the gradient modulation frequency except for the degenerate case of the one point in the null region which is derived from the carrier only.

In addition to the many other advantages previously discussed, this method has the distinct advantage of having a high degree of immunity to inhomogeneity of the magnetic field. High-field systems, especially those used for spectroscopy, are significantly deteriorated by subtle inhomogeneities in the magnetic field. This is the result of each acquisition representing a large region such as a line, plane or volume. Using time-varying gradients, however, the acquisition is highly localized. In this case we are only aware of the change in static field in the vicinity of the localized region which merely shifts the entire spectrum. Line-broadening due to inhomogeneity is minimized since there is a negligible change in the field in the localized region.

If desired, systems can be used to correct for the shift in the spectrum. One approach is to measure the dominant frequency in the localized region and use it for demodulation. Another approach, in spectroscopy, is to cross-correlate the spectrum with an approximate known spectrum and look for the cross-correlation peak.

In the first approach, a frequency estimation system, such as a counter, is used to determine the dominant frequency. This frequency is then used to demodulate the signal. Therefore, if the localized magnetic field is changed due to inhomogeneity, the system will be self-compensating. As a simple example, the frequency of signal 56 in FIG. 3 can be measured and used to generate the demodulation reference signal for demodulator 53. As previously indicated, the filtered output is centered at frequency $(\omega_0 - \omega_1)$ If, due to inhomogeneity, the region of interest has its local field shifted by $\Delta B$, the frequency will be shifted to $(\omega_0 + \gamma \Delta B - \omega_1)$. If this center frequency is measured, it can be used in the synchronous detector operations of demodulator 53 to make the system immune to inhomogeneity.

In the second approach, in spectroscopy, we have the output spectrum obtained by transforming signal 33 in FIG. 3, shifted by an amount $\gamma \Delta B$. The spectrum is still intact since the line broadening is negligible due to the spatial localization. This spectrum can be cross correlated with a known spectrum of the material being studied. Even though the unknown spectrum will experience subtle variations, it will retain the same general form. Therefore, the cross correlation peak will occur at the frequency shift $\gamma \Delta B$. This is then used to correct the spectrum so that the individual lines can be properly identified.

What is claimed is:

1. In a method for measuring the NMR activity of points in a volume the steps of:
   exciting the volume with an rf excitation signal;
   receiving signals emitted from the volume in the presence of a time-varying magnetic field gradients in the three axes; and
   processing the received signal to derive information about the NMR activity of points in the volume using a plurality of components of the frequency spectrum of the received signal to derive information about each point.

2. In a method for measuring the NMR activity of points in a volume the steps of:
   exciting the volume with an rf excitation signal;
   receiving signals emitted from the volume in the presence of a time varying magnetic field gradient:
   multiplying the received signal by a heterodyne signal phase modulated by a function of the time-varying magnetic field gradient to provide a mixed signal;
   demodulating the mixed signal to obtain a demodulated signal; and
   integrating the demodulated signal.

3. The method as described in claim 1 wherein the step of processing includes the steps of:
   convolving the frequency spectrum of the received signal with the frequency spectrum of a sinusoidal signal phase-modulated by a function of the time-varying magnetic field gradient; and
   measuring the amplitude of the carrier frequency component of the convolved signal.

4. The method as described in claim 1 wherein the step of processing includes the steps of:
   weighting each significant component of the frequency spectrum of the received signal by a predetermined set of weights representing the sideband amplitudes of a sinusoid phase modulated by a function of the time-varying gradient modulation signal which determine the position of the point in the volume; and summing the weighted components.

5. The method as described in claim 2 where the gradient signal is periodic and including the step of demodulating sidebands of the mixed signal separated from the carrier by multiples of the gradient modulation frequency and adding weighted amounts of the demodulated sideband signals to the integrated signal whereby a more localized spatial response function is derived.

6. The method as described in claim 3 where the gradient signal is periodic and including the step of measuring the amplitude of sidebands of the carrier frequency of the convolved signal separated from the carrier by multiples of the gradient modulation frequency and adding weighted mounts of the sideband amplitudes to the amplitude of the carrier frequency component whereby a more localized spatial response function is derived.

7. The method as described in claim 4 where the gradient signal is periodic and including the steps of similarly weighting the frequency spectrum of the received signal using a translated version of the predetermined set of weights and combining the translated weighted spectrum with the weighted spectrum whereby a more localized spatial response function is derived.

8. In a method for deriving NMR spectral information from points in a volume the steps of:

exciting the volume with an rf excitation signal;

receiving signals from the volume in the presence of a periodic time-varying magnetic field gradient; and processing the received signal to derive NMR spectral information about points in the volume.

9. The method as described in claim 1 wherein the step of exciting the volume includes the step of simultaneously exciting the volume of interest and the step of receiving signals includes the step of receiving signals in the presence of three time-varying field gradients which are substantially mutually perpendicular.

10. The method as described in claim 1 wherein the step of processing the received signal includes the step of decomposing the signal into its fine frequency components to derive the NMR spectrum of material being studied at points in the volume.

11. The method as described in claim 1 including the step of processing the received signal to derive information about moving material in the volume.

12. The method as described in claim 1 including the step of processing the received signal to form projection images of the NMR activity of the volume.

13. Apparatus for measuring the NMR activity of a volume comprising:

means for exciting the volume with an rf excitation field;

means for receiving signals emitted from the volume in the presence of time-varying gradient fields in each of the three axes; and means for processing the received signal to derive information about the NMR activity of points in the volume using a plurality of components of the frequency spectrum of the received signal.

14. Apparatus for measuring the NMR activity of a volume comprising:

means for exciting the volume with an rf excitation field;

means for receiving signals emitted from the volume in the presence of a time-varying gradient field;

means for multiplying the received signal by a heterodyne gradient modulation signal which is phase modulated by a function of the time-varying magnetic field gradient signal to provide a mixed signal;

means for demodulating the mixed signal; and means for integrating the mixed signal.

15. Apparatus as described in claim 14 where the gradient modulation signal is periodic and including means for demodulating sidebands of the mixed signal separated from the carrier by multiples of the gradient modulation frequency and adding weighted amounts of the demodulated sideband signals to the integrated signal whereby a more localized spatial response function is derived.

16. Apparatus as described in claim 14 wherein the processing means includes:

means for convolving the frequency spectrum of the received signal with the frequency spectrum of a sinusoidal signal phase-modulated by a function of the time-varying magnetic field gradient signal; and means for measuring the amplitude of the carrier frequency component of the convolved signal.

17. Apparatus as described in claim 16 where the gradient modulation signal is periodic and including means for measuring the amplitude of sidebands of the carrier frequency of the convolved signal separated from the carrier by multiples of the gradient modulation frequency and adding weighted amounts of these sideband amplitudes to the amplitude of the carrier frequency component whereby a more localized spatial response function is derived.

18. Apparatus as described in claim 14 wherein the processing means includes:

means for weighting each significant component of the frequency spectrum of the received signal using a predetermined set of weights representing the sideband amplitudes of a sinusoid phase modulated by a function of the gradient modulation signal which determines the position of the point in the volume; and means for summing the weighted spectral components.

19. Apparatus as described in claim 18 where the gradient modulation signal is periodic and including means for similarly weighting the frequency spectrum of the received signal using a translated version of the predetermined set of weights and means for combining the translated weighted spectrum with the weighted spectrum whereby a more localized response function is derived.

20. Apparatus as described in claim 13 wherein the means for exciting the volume includes means for exciting a planar section of the volume and the means for receiving signals includes means for receiving signals in the presence of time-varying field gradients parallel to the planar section.

21. Apparatus as described in clam 20 including a first periodic time-varying field gradient and including a second periodic time-varying field gradient perpendicular to the first field gradient and having a frequency different than that of the first time-varying field gradient.

22. Apparatus as described in claim 20 including a first periodic time-varying field gradient and including a second periodic time-varying field gradient perpendicular to the first field gradient and having a frequency equal to that of the first time-varying field gradient and a phase substantially in phase quadrature with the first time-varying field gradient.

23. Apparatus as described in claim 14 wherein the means for exciting the volume includes means for simultaneously exciting the volume of interest and the means for receiving signals includes means for receiving signals in the presence of three time-varying field gradients which are substantially mutually perpendicular.

24. Apparatus as described in claim 23 wherein the three time-varying fields are periodic and modulated at substantially different frequencies.

25. Apparatus as described in claim 23 wherein two of the time-varying fields are periodic and of the same frequency and substantially in phase quadrature.

26. Apparatus as described in claim 13 wherein the means for exciting the volume includes means for simultaneously exciting the entire volume of interest and the means for receiving signals means for receiving signals in the presence of two time-varying gradients and one static gradient which are all substantially mutually perpendicular.

27. Apparatus as described in claim 26 wherein the two time-varying gradients are periodic with the same frequency and are substantially in phase quadrature.

28. Apparatus as described in claim 14 wherein the means for processing the received signal includes means for decomposing the signal into its fine frequency components to derive the NMR spectrum of the material being studied at a plurality of points in the volume.

29. Apparatus as described in claim 14 including means for storing the received signal whereby the processing can be subsequently performed.

30. Apparatus as described in claim 14 including means for processing the received signal to form projection images of the NMR activity of the volume.

31. Apparatus as described in claim 14 including means for processing the received signal to derive information about moving material in the volume.

32. Apparatus as described in claim 31 including means for measuring the NMR activity at times corresponding to two different velocities of the moving material and including means for subtracting the processed measurements.

33. Apparatus as described in claim 31 wherein the means for exciting the volume includes means for exciting a plurality of regions in the volume with an inversion excitation whereby only moving material will provide received signals.

34. Apparatus as described in claim 33 wherein the means for exciting the volume includes means for exciting a plurality of regions in the volume and the means for processing the received signals includes means for receiving signals from the unexcited regions of the volume whereby moving material having flowed into the unexcited regions will be measured.

35. Apparatus as described in claim 33 including means for receiving signals from the excited regions of the volume and combining these measurements with those of the unexcited regions.

36. Apparatus as described in claim 14 wherein the processing means includes means for sequentially deriving information about the points in the volume.

37. Apparatus as described in claim 14 wherein the processing means includes means for simultaneously deriving information about the points in the volume.

38. Apparatus as described in claim 14 including means for sequentially deriving information about one dimension in the volume while simultaneously deriving information about points in an orthogonal dimension in the volume.

39. Apparatus as described in claim 14 wherein the time-varying gradient fields are aperiodic.

40. Apparatus as described in claim 39 including a second aperiodic time-varying gradient field in each axis, said fields in each axis being substantially spatially orthogonal and whose integrals are substantially electrically orthogonal.

41. Apparatus as described in claim 39 wherein one time-varying gradient field is a ramp function.

42. Apparatus as described in claim 40 including two orthogonal polynomials which modulate the gradient fields of two substantially orthogonal axes.

43. Apparatus as described in claim 39 including a static gradient field in substantial spatial quadrature to the time-varying gradient fields.

44. Apparatus as described in claim 41 wherein the means for processing the received signal includes means for multiplying the received signal by a periodic signal whose phase has a quadratic time-varying component.

45. Apparatus as described in claim 41 wherein the means for processing the received signal includes means for convolving the signal with a quadratic phase function.

46. Apparatus as described in claim 14 wherein a multiplying signal in said means for multiplying is phase modulated by the integral of the time-varying magnetic field gradient signal.

47. The method as described in claim 2 where the average frequency of the heterodyne signal is the same as that of the received signal so that the multiplying step includes the demodulating step.

48. Apparatus as described in claim 14 where the average frequency of the heterodyne signal is the same as the average frequency of the received signal where the means for multiplying includes the means for demodulating.

49. In a method for imaging the NMR activity of points in a volume the steps of:
    exciting the volume with an rf excitation signal;
    receiving signals from the volume in the presence of a periodic time-varying magnetic gradient;
    deriving the frequency spectrum of the received signal; and
    taking a weighted sum of the spectral components representing each point in the volume.

50. In a method for imaging the NMR activity of points in a region in the presence of static magnetic field inhomogeneities the steps of:
    exciting the region with an rf excitation signal;
    receiving signals from the region in the presence of time-varying magnetic gradients;
    processing the signals to isolate the activity of points within the region; and
    compensating for the frequency shift of each point caused by magnetic field inhomogeneities.

51. In a method for deriving information from moving material in a volume the steps of:
    exciting the volume with an rf signal;
    receiving signals emitted from the volume in the presence of a time-varying field gradient; and processing the received signal to derive information about the moving material at points along the direction of the gradient.

52. Apparatus for measuring the NMR activity points in a volume comprising:
   means for exciting the volume with an rf excitation field;
   means for receiving signals from the volume in the presence of a periodic time-varying gradient field;
   means for Fourier transforming the received signal to form a line spectrum where the lines are separated by the periodicity of the gradient modulation;
   means for weighting the amplitude of the line spectrum with weights based on the desired point in the volume; and
   means for summing the weighted spectral line amplitudes.

53. Apparatus for providing a projection of the NMR activity in a volume comprising:
   means for exciting the entire volume with an rf excitation field;
   means for receiving signals from the volume in the presence of two time-varying gradient fields in two orthogonal spatial axes; and
   means for processing the received signal to derive a projection of the volume in a direction normal to the two orthogonal spatial axes.

54. Apparatus for providing information about moving material in a volume comprising:
   means for exciting the volume with an rf excitation field;
   means for receiving signals from the volume in the presence of a time-varying gradient field; and
   means for processing the received signal to cancel static material and derive information about moving material in the volume.

55. Apparatus for measuring the NMR activity of points in a volume comprising:
   means for exciting the volume with rf excitation field;
   means for receiving signals from the volume in the presence of a time-varying gradient field composed of polynomial components;
   means for processing the received signal to measure the NMR activity of points in the volume.

56. Apparatus for imaging the NMR activity in a region comprising:
   means for exciting the volume with an rf excitation signal;
   a gradient field coil which is part of a resonant circuit;
   means for receiving signals in the presence of a sinusoidal gradient field signal applied to the resonant circuit; and
   means for processing the received signal to derive NMR information about points in the volume.

* * * * *